(12) United States Patent
Kennedy et al.

(10) Patent No.: US 9,733,285 B2
(45) Date of Patent: Aug. 15, 2017

(54) DYNAMIC THERMAL MAPPING (71) Applicant: QHi Group Limited, Harpenden, Hertfordshire (GB)

(72) Inventors: Ross Kennedy, Harpenden (GB); John Hope, Doncaster (GB)

(73) Assignee: QHI Group Inc., New York, NY (US)

( * ) Notice: Subject to any disclaimer, the term of this patent is extended or adjusted under 35 U.S.C. 154(b) by 1108 days.

(21) Appl. No.: 13/689,340

(22) Filed: Nov. 29, 2012

(65) Prior Publication Data
US 2013/0138371 A1    May 30, 2013

(30) Foreign Application Priority Data

Nov. 29, 2011 (GB) .................................. 1120549.9

(51) Int. Cl.
*G01R 21/06* (2006.01)
*G06F 17/00* (2006.01)
(Continued)

(52) U.S. Cl.
CPC ............. *G01R 21/06* (2013.01); *G01R 31/04* (2013.01); *G06F 17/00* (2013.01); *H05K 7/20* (2013.01)

(58) Field of Classification Search
CPC .... G01R 21/14; G01R 31/2874; G01R 19/32; G01R 21/06; G01R 31/04; G06F 11/3058;
(Continued)

(56) References Cited

U.S. PATENT DOCUMENTS

2007/0207656 A1    9/2007   Miettinen
2009/0080130 A1    3/2009   Hein
(Continued)

FOREIGN PATENT DOCUMENTS

CA          2706503 A1      7/2011

OTHER PUBLICATIONS

Lyons et al. ("The relationship between current load and temperature for quasi-steady state and transient conditions" Thermosense XXII, Ralph B. Dinwiddie, Dennis H. LeMieux, Editors, Proceedings of SPIE vol. 4020 (2000) • 0277-786X/00).*
(Continued)

*Primary Examiner* — Gregory J Toatley
*Assistant Examiner* — Kyle R Quigley
(74) *Attorney, Agent, or Firm* — Anderson Gorecki LLP (57) ABSTRACT

A load calculation device for determining the maximum electrical load that can be applied to an electrical circuit includes determines the temperature differential ($\Delta T$) between a section of the electrical circuit and the ambient air temperature in which the section of the electrical circuit resides. The actual electrical load applied to the electrical circuit is also determined as is the design load of the electrical circuit. The maximum electrical load that can be applied to the electrical circuit is then determined based on the temperature differential and the electrical load applied to the electrical circuit and the circuit designed load. The load calculation device may be applied to an electrical joint and may be used to calculate the maximum temperature differential allowed for a given current to be applied at the electrical joint. This is particularly beneficial in connection with detecting and preventing electrical joint failure.

15 Claims, 1 Drawing Sheet

(51) Int. Cl.
*H05K 7/20* (2006.01)
*G01R 31/04* (2006.01)

(58) Field of Classification Search
CPC ...... G06F 17/00; H05K 7/20518; H05K 7/20;
H02B 13/065; H02J 13/00
USPC .............................................. 702/57–58, 64
See application file for complete search history.

(56) References Cited

U.S. PATENT DOCUMENTS

2010/0145641 A1* 6/2010 Bose .................... G01R 31/327
702/58
2011/0181294 A1 7/2011 Ziegler

OTHER PUBLICATIONS

IEEE Standard for Metal-Clad Switchgear (IEEE Std C37.20.2TM-1999 (R2005)).*
Search Report from related GB patent application 1120549.9.
Search Report from related EP patent application 12194778.2.

* cited by examiner

DYNAMIC THERMAL MAPPING

FIELD OF THE INVENTION

The present invention relates to systems, devices and methods for monitoring and controlling the electrical load and ambient temperature of electrical joints and electrical conductors in electrical circuits.

BACKGROUND OF THE INVENTION

Electrical joints in an electrical circuit are internationally recognized as one of the major causes of electrical failures in the electrical circuit. At the electrical loads associated with commercial use, failures of such electrical joints often results in an arc flash.

The arc flash causes an explosion which may result in a serious if not fatal injury to any person in close proximity to the compromised electrical joint when it fails. Furthermore, severe damage will be caused to the electrical equipment itself and there will be a loss of power to the affected circuits.

Thus the failure of an electrical joint can have serious economic, environmental and safety consequences. This is particularly applicable in organisations which have high downtime costs such as data centres, oil and gas production, refining and other high value large scale manufacturing sites.

The issue of electrical joint failure is so serious that commercial insurers often mandate the client to undertake annual inspections of their electrical equipment in general and particularly any mission critical electrical equipment which may result in the cessation of the business or for business to be severely interrupted should it fail.

The electrical joints may be, for example, joints between two sections of metal conductors, which are typically formed from copper or aluminium, or at the termination of a section of an electrical cable to a metal conductor.

At present the only way to detect if the integrity of an electrical joint has been compromised is to detect excess heat at the electrical joint. There are currently two methods used to detect such compromised joints.

The first method is periodic inspection of the electrical joints using a thermal imaging camera. Such inspections will be carried out whilst the electrical circuit and thus the electrical joint is energised with typically 50% or less of electrical load designed for the electrical circuit and thus the electrical joint. Depending on the particular country and the regulations in force the energised joints may or may not be exposed during the inspection. When the joints are not exposed the inspection is carried out externally, sometimes using a thermal window to enhance the level of infrared radiation visible to the thermal imaging camera.

The problem is that such inspections are often only carried out annually, i.e. 1 day out of 365, less than 1% of the operating time of the electrical circuit. As such any problems which develop with the electrical joints, to cause them to become compromised, may go unnoticed for a long period of time. Furthermore if the inspection is carried out externally a calculated correlation of the external temperature to the internal temperature of the electrical joint will need to be carried out. Given the number of variables at each location, the correlation is subject to errors, which may be large. In addition as such inspections are carried out at unknown or low electrical loads, i.e. below 50%, the inspection is often unable to determine that an electrical joint is compromised.

The second method is a more recent technology which enables thermal measurement of the joint to be carried out using passive thermal sensing devices which are located inside the electrical enclosure in which the electrical joint is housed to directly and continuously monitor the electrical joint. The thermal sensing devices measure the ambient temperature of the air in the enclosure in which the electrical joint resides, and the temperature of the electrical joint to calculate the temperature differential of the electrical joint, known as the $\Delta T$ value.

The temperature of the electrical joint uses a sensor which is typically either an infrared sensor located a short distance from the electrical joint which either measures the temperature of the electrical joint itself or the temperature of the electrical conductor adjacent the electrical joint, or a cable sensor which is mounted directly onto cable conductors adjacent the electrical joint. Other sensing devices may be used provided that they measure the temperature at the electrical joint itself or of the conductor adjacent to the electrical joint.

There are problems with both of these methods in that whilst it is theoretically possible to subsequently identify the electrical load that was applied to the electrical circuit on which a given electrical joint is located, and then correlate this with the $\Delta T$ value from the thermal inspection to determine whether or not a joint is compromised, this is not always so simple in practice.

In an organisation with many electrical circuits, and thus electrical joints, this process would be very time consuming, and thus unlikely to be commercially viable.

Furthermore thermal inspection reports are not typically integrated with computer building management systems, thus data would need to be collected from a number of sources which may have different time stamps, therefore such calculations are not always reliable, nor can they dynamically predict how much additional load can be safely applied to an electrical circuit which is at a low electrical load, i.e. the maximum safe operating capacity, at any given time.

The determination of how much extra electrical load can be safely added to an electrical joint in an electrical circuit is particularly important in organisations which operate systems with dual electrical feeds. Quite often an electrical feed will be shut down for periodic maintenance. This results in both electrical feeds being fed into a single feed. Thus, where both feeds originally operated at 30% electrical load, a single feed is now operating at 60% electrical load.

Such sudden increases in electrical load often result in a compromised electrical joint failing, as whilst the compromised electrical joint could cope with 30% electrical load, the compromised electrical joint could not cope with 60% electrical load. Neither periodic thermal inspection nor continuous monitoring would have been able to detect that such an electrical joint was compromised at low electrical load levels.

A further problem is that electrical circuits, and thus electrical joints normally have designated maximum operating temperatures imposed by the manufacturers, i.e. the maximum temperature at which they can be safely operated. Furthermore, there may be other maximum operating temperatures imposed by industry standard organisations such as UL, IEC and ANSI. However, this temperature is affected by both the electrical load being applied to the electrical joint and the local ambient temperature.

Thus if the local ambient temperature is high it may be necessary to reduce the electrical load passing through the electrical joint to ensure that the maximum safe operating temperature is not exceeded.

For example;

The maximum temperature at which an electrical joint can be operated at 100% load is dependent on the particular standards being adhered, i.e. British Standards, UL, IEC or ANSI standards. These standards stipulate a maximum rise of 50° C. above a 24 hour mean ambient temperature of up to 35° C. with an absolute maximum of 85° C., and peak ambient temperature of 40° C. with an absolute maximum of 90° C. ANSI alternatively permits a temperature rise of 65° C. above a maximum ambient temperature of 40° C. with an absolute maximum of 105° C. provided that silver plated terminations (or acceptable alternative) are provided in the electrical joint, if not then a maximum temperature rise of 30° C. is allowable with an absolute maximum of 70° C. For example, a manufacturer would have used these standards to calculate that the maximum ambient temperature that a particular electrical joint can operate at 100% electrical load is 50° C., as the $\Delta T$ value for the joint is 65° C. Thus if the ambient temperature rises to 60° C. the maximum load that the electrical joint could be used with safely is that which gives a $\Delta T$ of 55° C.

There is currently no system which enables effective monitoring of ambient temperatures and $\Delta T$ values of an electrical joint or an electrical conductor assuming the electrical joint is not compromised to indicate the maximum electrical load which can be passed though the given electrical joint or electrical conductor at a given ambient temperature.

SUMMARY OF THE INVENTION

The present invention relates to a method of continuously predicting in real time when an electrical joint in an electrical circuit is compromised at a low electrical load. The present invention also relates to a method of continuously predicting in real time the maximum electrical load which can be passed through a compromised electrical joint in an electrical circuit, i.e. the maximum safe operating capacity of the electrical circuit. The present invention also relates to a method of continuously calculating the temperature differential alarm threshold in real time throughout the full range of electrical loads, i.e. from 0-100%, for a given electrical joint in an electrical circuit. The present invention also relates to a method of continuously predicting in real time the maximum electrical load that can be passed through an electrical circuit at the ambient temperature within which the electrical circuit resides. The present invention also relates to a method of predicting by how much the ambient temperature must be reduced in order to operate the circuit at up to 100% load. This provides the ability for the OEM's to incorporate this invention into their products to have intelligent electrical enclosures which can operate at maximum safe loads. This also provides the ability for the invention to be retrofitted into existing electrical systems.

According to a first aspect of the present invention there is provided a load calculation device for determining the maximum electrical load that can be applied to an electrical circuit comprising:

a. means for determining the temperature differential ($\Delta T$) between a section of the electrical circuit and the ambient air temperature in which the section of the electrical circuit resides;

b. means for determining the actual electrical load applied to the electrical circuit;

c. means for determining the design load of the electrical circuit;

d. means for calculating the maximum electrical load that can be applied to the electrical circuit based on the temperature differential and the electrical load applied to the electrical circuit.

Preferably the values are continuously determined by the load calculation device in real time. This means that the values are determined every 0.5 to 30 seconds.

Preferably the load calculation device is adapted to continuously calculate the maximum electrical load that can be applied to the electrical circuit is calculated in real time. This means that the values are calculated every 0.5 to 30 seconds.

Preferably the means for determining the temperature differential comprises receiving the temperature of the section of the electrical circuit from a first sensing element and receiving the temperature of the ambient air in which the electrical circuit resides from a second sensing element.

The sensing elements may be for example:

A combined sensing element located close to the electrical joint which has a first sensing element which measures the temperature of the electrical joint or the temperature of the electrical conductor adjacent the electrical joint using non contact infrared for example, or a contact device such as a thermocouple or a fibre optic sensing device, and a second sensing element which measures the ambient air temperature within the enclosure. In one alternative such a combined sensing element sends each measurement separately to the local calculation device. In an alternative such a combined sensing element is provided with a device adapted to determine the $\Delta T$ value of the electrical joint or of the conductor adjacent the electrical joint which is effectively the $\Delta T$ value of the joint and the combined sensing element sends the $\Delta T$ value to the local calculation device.

Separate contact or non contact sensing elements, the first sensing element located above the electrical joint which measures the temperature of the electrical joint or the temperature of the electrical conductor adjacent the electrical joint using infrared for example, and the second sensing element located remote from the first sensing element but still within the enclosure which measures the ambient air temperature within the enclosure. The load calculation device would then determine the $\Delta T$ value based on the individual temperature values.

Separate linked elements, the first sensing element is located near or on the external insulating layer of an electrical conductor, in the case of an electrical cable, adjacent to the electrical joint which measures the temperature of the electrical conductor adjacent to the electrical joint which is connected to the second sensing element located remote from the first sensing element but still within the enclosure which measures the ambient air temperature within the enclosure wherein the second sensing element is provided with a device adapted to determine the $\Delta T$ value of the electrical conductor adjacent to the electrical joint which is effectively the $\Delta T$ value of the electrical joint which then sends the $\Delta T$ value to the load calculation device.

Preferably the section of the electrical circuit comprises an electrical joint.

Preferably the load calculation device further comprises means for determining the maximum temperature differential allowed.

According to a second aspect of the present invention the maximum electrical load that can be applied to the electrical joint is determined by using the following values:
 a. the design load of the electrical joint;
 b. the temperature differential;
 c. the maximum temperature differential allowed; and
 d. the actual load of the electrical joint.

Preferably the maximum electrical load that can be applied to the electrical joint is determined by:
 a. determining the percentage load applied to the electrical joint from the actual load of the electrical joint and the design load of the electrical joint;
 b. determining what the temperature differential would be at the design load of the electrical joint from the temperature differential and the percentage load applied to the electrical joint determined in step a;
 c. determining the equivalent temperature load ratio for the maximum temperature differential allowed from the temperature differential determined in step b and the maximum temperature differential allowed; and
 d. determining the maximum electrical load that can be applied to the electrical joint using the design load of the electrical joint and the equivalent temperature load ratio determined in step c.

This is advantageous as the system provides for the first time a real time continuous detection of compromised joint fails by indicating that a reduced maximum electrical load can be applied to the electrical circuit compared to that which the electrical circuit is designed to handle. The system also calculates the maximum electrical load that can be applied to the electrical circuit before the joint fails so that once a compromised joint has been detected it does not then go on to fail by increasing the electrical load beyond that which it can safely handle. This means that reduced downtime periods would be experienced without catastrophic electrical failures.

Preferably the maximum electrical load that can be applied to the electrical joint is determined by the following calculations:

a. $\left(\dfrac{\text{actual load of electrical joint}}{\text{design load of electrical joint}}\right) \times 100 =$ % load (applied to the electrical joint)

b. $\dfrac{100^2}{\% \, load^2} = $ temperature ratio c. temperature ratio × actual $\Delta T$ value =

$\Delta T$ value at design load of electrical joint d. $\sqrt{\dfrac{\Delta T \text{ value at design load of electrical joint}}{\text{maximum} \, \Delta T \text{ value allowed}}} =$ equivalent temperature load ratio e. $\dfrac{\text{design load of electrical joint}}{\text{equivalent temperature load ratio}} = $ maximum electrical load Preferably the load calculation device is further adapted to determine if the electrical joint is compromised by comparing the maximum electrical load with the design load of the electrical joint, wherein an electrical joint is compromised if the maximum electrical load is less than the design load of the electrical joint Alternatively the section of the electrical circuit comprises an electrical conductor remote from an electrical joint.

Preferably the load calculation device further comprises means for determining the maximum conductor temperature allowed for the circuit According to a third aspect of the present invention the maximum electrical load that can be applied to the electrical circuit when the electrical circuit is at a particular ambient temperature is determined by using the following values:
 a. the design load of the electrical circuit;
 b. the temperature differential;
 c. the actual load of the electrical joint;
 d. the maximum conductor temperature allowed for the circuit; and
 e. the ambient temperature.

This is also advantageous as the system provides for the first time a real time continuous detection of the maximum electrical load that can be passed through an electrical circuit which is at an elevated ambient temperature, i.e. in very hot countries for example. This means that at no time a greater electrical load than that which the electrical circuit can safely handle is applied to the electrical circuit, no matter what the ambient temperature actually is.

Preferably the maximum electrical load that can be applied to the electrical circuit when the electrical circuit is at a particular ambient temperature is determined by:
 a. determining the percentage load applied to the electrical circuit from the actual load of the electrical circuit and the design load of the electrical circuit;
 b. determining what the conductor temperature would be at the design load of the electrical circuit from the temperature differential, the ambient temperature and the percentage load applied to the electrical joint determined in step a;
 c. determining the equivalent temperature load ratio for the maximum conductor temperature allowed for the circuit from the conductor temperature determined in step b and the maximum conductor temperature allowed for the circuit;
 d. determining the maximum electrical load that can be applied to the electrical circuit when the electrical circuit is at a particular ambient temperature using the design load of the electrical circuit and the equivalent temperature load ratio.

Preferably the maximum electrical load that can be applied to the electrical circuit when the electrical circuit is at a particular ambient temperature is determined by the following calculations:

a. $\left(\dfrac{\text{electrical load of electrical circuit}}{\text{design load of electrical circuit}}\right) \times 100 =$ % load (applied to electrical circuit)

b. $\dfrac{100^2}{\% \, load^2} = $ temperature ratio c. temperature ratio × actual $\Delta T$ value =

$\Delta T$ value at 100% load d. $\Delta T$ value at 100% load + ambient temperature = conductor temperature at design load e. $\sqrt{\dfrac{\text{conductor temperature at design load}}{\text{maximum conductor temperature allowed for the circuit}}} =$ equivalent temperature load ratio f. $\dfrac{\text{design load of electrical circuit}}{\text{equivalent temperature load ratio}} = $ maximum load Preferably the load calculation device is adapted to communicate with a temperature control means adapted to control the air ambient temperature in which the circuit resides.

Preferably the temperature control means is adapted to control the ambient temperature such that the maximum load equals the design load of the electrical circuit.

Preferably the temperature control means is adapted to control the ambient temperature such that the maximum load can be safely increased beyond the design load of the electrical circuit.

Preferably the temperature control means comprises a fan.

Preferably the temperature control means comprises an air conditioning system.

Preferably the temperature control means comprises a liquid cooling system.

Preferably the load calculation device is adapted to calculate the electrical load remaining that can be applied to the electrical joint without exceeding the maximum electrical load.

Preferably the load calculation device is further adapted to prevent the electrical load that can be applied to the electrical joint from exceeding the maximum electrical load.

Preferably the load calculation device is adapted to communicate with a switching means which is adapted to communicate with a control device adapted to supply electrical load to the electrical circuit, such that when the switching means prevents the control device from supplying an electrical load to the electrical circuit that would exceed the maximum electrical load.

This is advantageous as the provision of a load calculation device which prevents more electrical load from being applied to a compromised electrical joint, or an electrical joint at elevated ambient temperature ensures that the electrical joint does not fail by adding more electrical load to the electrical joint than that which it can safely handle.

According to a fourth aspect of the present invention there is provided a load calculation device for monitoring an electrical joint comprising:
 a. means for determining the temperature differential ($\Delta T$) between the electrical joint and the ambient air temperature in which the electrical joint resides;
 b. means for determining the actual electrical load applied to the electrical joint;
 c. means for determining the design load of the electrical joint;
 d. means for determining the maximum allowed temperature differential; and
 e. means for calculating a temperature differential threshold for the electrical load being applied to the electrical joint based on the temperature differential and the electrical load applied to the electrical joint.

Preferably the values are continuously determined by the device in real time.

Preferably the device is further adapted to continuously calculate the temperature differential threshold for the electrical load being applied to the electrical joint in real time.

Preferably the temperature differential threshold for the electrical load being applied to the electrical joint is determined using the following values;
 a. the maximum allowed temperature differential;
 b. the design load of the electrical joint; and
 c. the actual load of the electrical joint.

Preferably the temperature differential threshold for the electrical load being applied to the electrical joint is determined by:
 a. determining the percentage load applied to the electrical joint from the actual load of the electrical joint and the design load of the electrical joint;
 b. determining the temperature differential threshold for the electrical load of the electrical joint using the design load of the electrical joint and the maximum allowed temperature differential.

Preferably the temperature differential threshold for the electrical load being applied to the electrical joint is determined by the following calculations:

a. $\left(\dfrac{\text{actual load of electrical joint}}{\text{design load of electrical joint}}\right) \times 100 =$ % load (applied to the electrical joint)

b. Maximum allowed $\Delta T$ value $\times \left(\dfrac{\% \text{ load}}{100}\right)^2 =$ $\Delta T$ value threshold Preferably the load calculation device determines whether the electrical joint is compromised by comparing the temperature differential threshold with the actual temperature differential.

Preferably the electrical joint is determined to be compromised when the actual temperature differential is greater than the temperature differential threshold.

Preferably the load calculation device further comprising an alarm and wherein the alarm is activated when the actual temperature differential is greater than the temperature differential threshold to notify that a compromised electrical joint has been located.

According to a fifth aspect of the present invention there is provided a load calculation device comprising a load calculation device for determining the maximum electrical load that can be applied to an electrical circuit and a load calculation device for monitoring an electrical joint.

According to a sixth aspect of the present invention there is provided a system comprising:
 a. a load calculation device as described in relation to any of the first to firth aspects of the present invention;
 b. a first sensing element for determining the temperature of the section of the electrical circuit; and
 c. a second sensing means for determining the ambient air temperature in which the section of the electrical circuit resides.

According to a seventh aspect of the present invention there is provided a method for determining the maximum electrical load that can be applied to an electrical circuit comprising:
 a. determining the temperature differential ($\Delta T$) between a section of the electrical circuit and the ambient air temperature in which the section of the electrical circuit resides;
 b. determining the actual electrical load applied to the electrical circuit;
 c. determining the design load of the electrical circuit;
 d. determining the maximum electrical load that can be applied to the electrical circuit based on the temperature differential and the electrical load applied to the electrical circuit.

Preferably the maximum electrical load that can be applied to the electrical circuit is continuously determined in real time. This means that the values are determined every 0.5 to 30 seconds.

Preferably the values are continuously determined in real time. This means that the values are determined or calculated every 0.5 to 30 seconds.

Preferably the temperature differential is determined by determining the temperature of the section of the electrical circuit and determining the temperature of the ambient air in which the electrical circuit resides.

The sensing elements may be for example:

A combined sensing element located close to the electrical joint which has a first sensing element which measures the temperature of the electrical joint or the temperature of the electrical conductor adjacent the electrical joint using non contact infrared for example, or a contact device such as a thermocouple or a fibre optic sensing device, and a second sensing element which measures the ambient air temperature within the enclosure. In one alternative such a combined sensing element sends each measurement separately to the local calculation device. In an alternative such a combined sensing element is provided with a device adapted to determine the $\Delta T$ value of the electrical joint or of the conductor adjacent the electrical joint which is effectively the $\Delta T$ value of the joint and the combined sensing element sends the $\Delta T$ value to the local calculation device.

Separate contact or non contact sensing elements, the first sensing element located above the electrical joint which measures the temperature of the electrical joint or the temperature of the electrical conductor adjacent the electrical joint using infrared for example, and the second sensing element located remote from the first sensing element but still within the enclosure which measures the ambient air temperature within the enclosure. The load calculation device would then determine the $\Delta T$ value based on the individual temperature values.

Separate linked elements, the first sensing element is located near or on the external insulating layer of an electrical conductor, in the case of an electrical cable, adjacent to the electrical joint which measures the temperature of the electrical conductor adjacent to the electrical joint which is connected to the second sensing element located remote from the first sensing element but still within the enclosure which measures the ambient air temperature within the enclosure wherein the second sensing element is provided with a device adapted to determine the $\Delta T$ value of the electrical conductor adjacent to the electrical joint which is effectively the $\Delta T$ value of the electrical joint which then sends the $\Delta T$ value to the load calculation device.

Preferably the section of the electrical circuit comprises an electrical joint.

Preferably the method further comprises determining the maximum temperature differential allowed.

According to an eighth aspect of the present invention the maximum electrical load that can be applied to the electrical joint is determined by using the following values:
 a. the design load of the electrical joint;
 b. the temperature differential;
 c. the maximum temperature differential allowed; and
 d. the actual load of the electrical joint.

Preferably the maximum electrical load that can be applied to the electrical joint is determined by:
 a. determining the percentage load applied to the electrical joint from the actual load of the electrical joint and the design load of the electrical joint;
 b. determining what the temperature differential would be at the design load of the electrical joint from the temperature differential and the percentage load applied to the electrical joint determined in step a;
 c. determining the equivalent temperature load ratio for the maximum temperature differential allowed from the temperature differential determined in step b and the maximum temperature differential allowed; and
 d. determining the maximum electrical load that can be applied to the electrical joint using the design load of the electrical joint and the equivalent temperature load ratio determined in step c.

This is advantageous as the method provides for the first time a real time continuous detection of compromised electrical joints in electrical circuits, before the compromised joint fails by determining that a reduced maximum electrical load can be applied to the electrical joint compared to that which the electrical joint is designed to handle. The method also calculates the maximum electrical load that can be applied to the electrical joint before it fails so that once a compromised joint has been detected it does not then go on to fail by increasing the electrical load beyond that which it can safely handle. This means that reduced downtime periods would be experienced without catastrophic electrical failures.

Preferably the maximum electrical load that can be applied to the electrical joint is determined by the following calculations:

a. $\left(\dfrac{\text{actual load of electrical joint}}{\text{design load of electrical joint}}\right) \times 100 =$ %  load (applied to the electrical joint)

b. $\dfrac{100^2}{\%\ load^2} =$ temperature ratio c. temperature ratio $\times$ actual $\Delta T$ value $=$ $\Delta T$ value at design load of electrical joint d. $\sqrt{\dfrac{\Delta T \text{ value at design load of electrical joint}}{\text{maximum} \Delta T \text{ value allowed}}} =$ equivalent temperature load ratio e. $\dfrac{\text{design load of electrical joint}}{\text{equivalent temperature load ratio}} =$ maximum electrical load Preferably the method further comprises determining if the electrical joint is compromised by comparing the maximum electrical load with the design load of the electrical joint, wherein an electrical joint is compromised if the maximum electrical load is less than the design load of the electrical joint.

Preferably the section of the electrical circuit comprises an electrical conductor remote from an electrical joint.

Preferably the method further comprises determining the maximum conductor temperature allowed for the circuit.

According to a ninth aspect of the present invention the maximum electrical load that can be applied to the electrical circuit when the electrical circuit is at a particular ambient temperature is determined by using the following values:
 a. the design load of the electrical circuit;
 b. the temperature differential;
 c. the actual load of the electrical joint;
 d. the maximum conductor temperature allowed for the circuit; and
 e. the ambient temperature.

This is also advantageous as the method provides for the first time a real time continuous detection of the maximum electrical load that can be passed through an electrical joint which is at an elevated ambient temperature, i.e. in very hot countries for example. This means that at no time a greater electrical load than that which the electrical joint can safely handle is applied to the electrical joint, no matter what the ambient temperature.

Preferably the maximum electrical load that can be applied to the electrical circuit when the electrical circuit is at a particular ambient temperature is determined by:
  a. determining the percentage load applied to the electrical circuit from the actual load of the electrical circuit and the design load of the electrical circuit;
  b. determining what the conductor temperature would be at the design load of the electrical circuit from the temperature differential, the ambient temperature and the percentage load applied to the electrical joint determined in step a;
  c. determining the equivalent temperature load ratio for the maximum conductor temperature allowed for the circuit from the conductor temperature determined in step b and the maximum conductor temperature allowed for the circuit;
  d. determining the maximum electrical load that can be applied to the electrical circuit when the electrical circuit is at a particular ambient temperature using the design load of the electrical circuit and the equivalent temperature load ratio.

Preferably the maximum electrical load that can be applied to the electrical circuit when the electrical circuit is at a particular ambient temperature is determined by the following calculations:

a. $\left(\dfrac{\text{electrical load of electrical circuit}}{\text{design load of electrical circuit}}\right) \times 100 =$ % load (applied to electrical circuit)

b. $\dfrac{100^2}{\% \; load^2} = $ temperature ratio c. temperature ratio × actual $\Delta T$ value =

$\Delta T$ value at 100% load d. $\Delta T$ value at 100% load + ambient temperature = conductor temperature at design load e. $\sqrt{\dfrac{\text{conductor temperature at design load}}{\text{maximum conductor temperature allowed for the circuit}}} =$ equivalent temperature load ratio f. $\dfrac{\text{design load of electrical circuit}}{\text{equivalent temperature load ratio}} = $ maximum load Preferably the method further comprises communicating with a temperature control means adapted to control the air ambient temperature in which the section of the circuit resides.

Preferably the temperature control means is adapted to control the ambient temperature such that the maximum load equals the design load of the electrical circuit.

Preferably the temperature control means is adapted to control the ambient temperature such that the maximum load can be safely increased beyond the design load of the electrical circuit.

Preferably the temperature control means comprises a fan.

Preferably the temperature control means comprises an air conditioning system.

Preferably the temperature control means comprises a liquid cooling system.

Preferably the method further comprises calculating the electrical load remaining that can be applied to the electrical joint without exceeding the maximum electrical load.

Preferably the method further comprises preventing the electrical load that can be applied to the electrical joint from exceeding the maximum electrical load.

Preferably the method further comprises communicating with a switching means which is adapted to communicate with a control device adapted to supply electrical load to the electrical circuit, such that when the switching means prevents the control device from supplying an electrical load to the electrical circuit that would exceed the maximum electrical load.

This is advantageous as the provision of a method which prevents more electrical load from being applied to a compromised electrical joint, or an electrical joint at elevated ambient temperature ensures that the electrical joint does not fail by adding more electrical load to the electrical joint than that which it can safely handle.

According to a tenth aspect of the present invention there is provided a method for determining the temperature differential threshold for an electrical load being applied to an electrical joint comprising:
  a. determining the temperature differential ($\Delta T$) between the electrical joint and the ambient air temperature in which the electrical joint resides;
  b. determining the actual electrical load applied to the electrical joint;
  c. determining the design load of the electrical joint;
  d. determining the maximum allowed temperature differential; and
  e. determining the temperature differential threshold for the electrical load being applied to the electrical joint based on the temperature differential and the electrical load applied to the electrical joint.

Preferably the values are continuously determined in real time.

Preferably the temperature differential threshold for the electrical load being applied to the electrical joint is continuously determined in real time.

Preferably the temperature differential threshold for the electrical load being applied to the electrical joint is determined using the following values;
  a. the maximum allowed temperature differential;
  b. the design load of the electrical joint; and
  c. the actual load of the electrical joint.

Preferably the temperature differential threshold for the electrical load being applied to the electrical joint is determined by:
  a. determining the percentage load applied to the electrical joint from the actual load of the electrical joint and the design load of the electrical joint;
  b. determining the temperature differential threshold for the electrical load of the electrical joint using the design load of the electrical joint and the maximum allowed temperature differential.

Preferably the temperature differential threshold for the electrical load being applied to the electrical joint is determined by the following calculations:

a. $\left(\dfrac{\text{actual load of electrical joint}}{\text{design load of electrical joint}}\right) \times 100 =$ b. Maximum allowed $\Delta T$ value $\times \left(\dfrac{\% \text{ load}}{100}\right)^2 = \Delta T$ value threshold % load (applied to the electrical joint)

Preferably the method further comprises determining whether the electrical joint is compromised by comparing the temperature differential threshold with the actual temperature differential.

Preferably the electrical joint is determined to be compromised when the actual temperature differential is greater than the temperature differential threshold.

Preferably the method further comprises activating an alarm when the actual temperature differential is greater than the temperature differential threshold to notify that a compromised electrical joint has been located.

According to an eleventh aspect of the present invention there is provided a method comprising a method for determining the maximum electrical load that can be applied to an electrical circuit and a method for determining the temperature differential threshold for an electrical load being applied to an electrical joint.

According to a twelfth aspect of the present invention there is provided a computer program embedded in a computer readable media that when executed by a device causes the device to perform the method according to any of the seventh to eleventh aspects of the present invention.

BRIEF DESCRIPTION OF THE DRAWINGS

The invention will now be described by way of example only, with reference to the accompanying drawing in which.

DESCRIPTION OF THE PREFERRED EMBODIMENTS

Embodiments of the present invention are described below by way of example only. These embodiments represent the best ways of putting the invention into practice that are currently known to the Applicant, although they are not the only ways in which this could be achieved.

Figure 1:
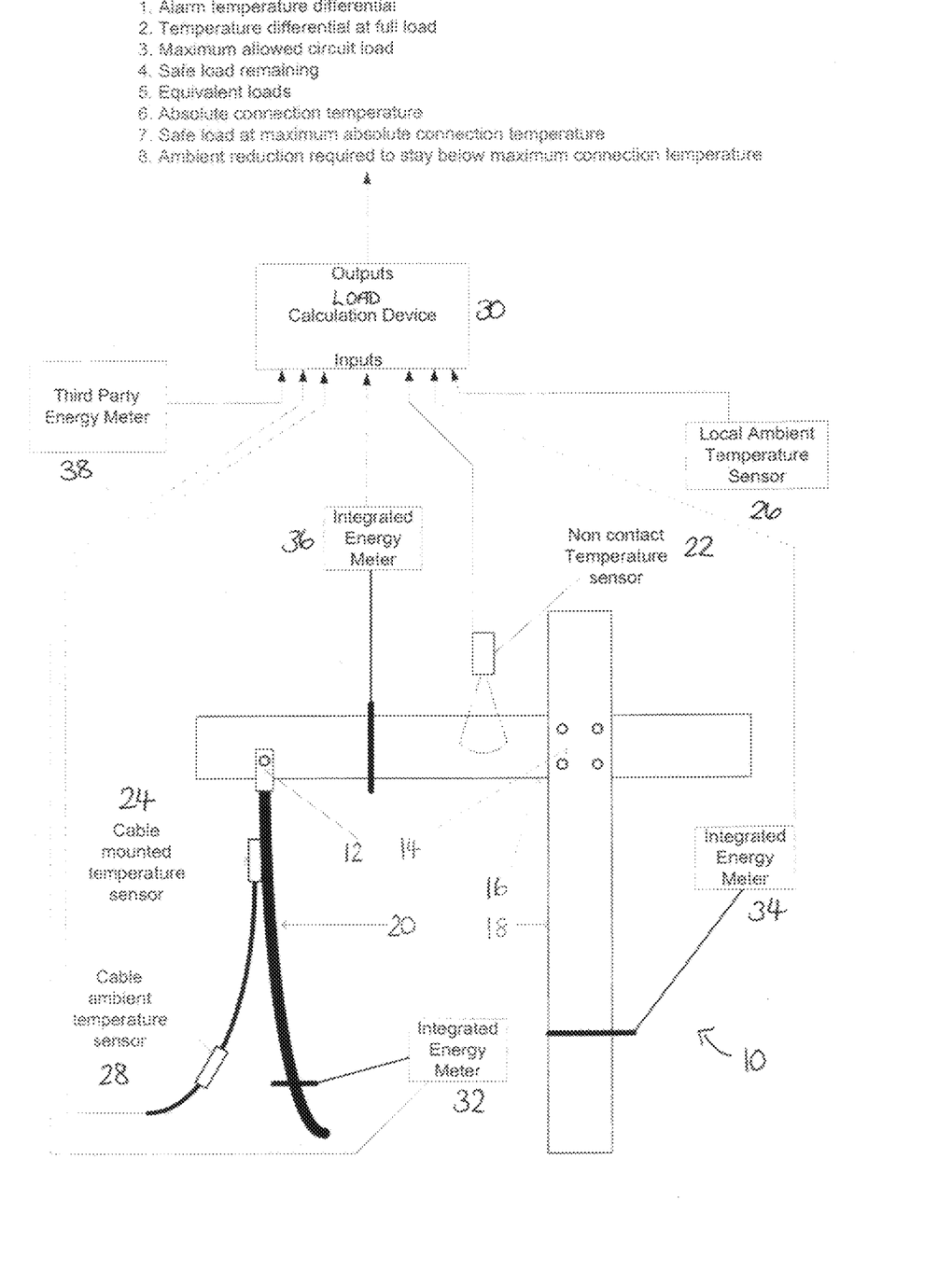
FIG. 1 illustrates an exemplary electrical circuit.

FIG. 1 shows an exemplary electrical circuit 10 illustrating two types of electrical joints 12, 14 between different types of conductor 14, 16. 18. The electrical joint 14 may be for example a joint between metal connectors 16, 18, which are typically formed from copper or aluminium, or the joint 12 may be at the termination of an electric cable 20 to a metal connector 16, or any other joint in an electrical circuit between two or more components.

The electrical joint 12, 14 is provided with a first sensing element 22, 24 which measures the temperature of the electrical joint 12, 14. The first sensing element 22, 24 is located within the electrical enclosure in which the electrical circuit 10 is located so that the temperature of the electrical joint is obtained accurately and without any need for correlation. The first sensing element 22 is an example of a non contact temperature sensor. The first sensing element 22 may either measure the temperature of the electrical joint 14 or the temperature of the electrical conductor 16 adjacent the electrical joint 14 as this will be at around the same temperature. The first sensing element 24 is an example of a cable mounted contact temperature sensor. The first sensing element 24 may measures the temperature of the electrical cable 24 adjacent the electrical joint 12 as this will be at around the same temperature as that of the electrical joint 12 itself.

A second sensing element 26, 28 is also provided within the electrical enclosure in which the electrical circuit 10 is located which measures the ambient temperature of the air within the electrical enclosure. The second sensing element 26 is an example where the local ambient temperature sensor is remote from the first sensing element and not directly connected thereto. The second sensing element 28 is an example of where the local ambient temperature sensor is connected to the first sensing element 24.

The second sensing element may be separate from the first sensing element or combined with the first sensing element.

The temperature differential or $\Delta T$ value of the electrical joint is the difference between the temperature of the electrical joint (or the electrical conductor adjacent thereto) and the ambient temperature.

The sensing elements may be for example:

A combined sensing element located close to the electrical joint which has a first sensing element which measures the temperature of the electrical joint or the temperature of the electrical conductor adjacent the electrical joint using non contact infrared for example, or a contact device such as a thermocouple or a fibre optic sensing device, and a second sensing element which measures the ambient air temperature within the enclosure. In one alternative such a combined sensing element sends each measurement separately to the local calculation device. In an alternative such a combined sensing element is provided with a device adapted to determine the $\Delta T$ value of the electrical joint or of the conductor adjacent the electrical joint which is effectively the $\Delta T$ value of the joint and the combined sensing element sends the $\Delta T$ value to the local calculation device.

Separate contact or non contact sensing elements, the first sensing element located above the electrical joint which measures the temperature of the electrical joint or the temperature of the electrical conductor adjacent the electrical joint using infrared for example, and the second sensing element located remote from the first sensing element but still within the enclosure which measures the ambient air temperature within the enclosure. The load calculation device would then determine the $\Delta T$ value based on the individual temperature values.

Separate linked elements, the first sensing element is located near or on the external insulating layer of an electrical conductor, in the case of an electrical cable, adjacent to the electrical joint which measures the temperature of the electrical conductor adjacent to the electrical joint which is connected to the second sensing element located remote from the first sensing element but still within the enclosure which measures the ambient air temperature within the enclosure wherein the second sensing element is provided with a device adapted to determine the $\Delta T$ value of the electrical conductor adjacent to the electrical joint which is effectively the $\Delta T$ value of the electrical joint which then sends the $\Delta T$ value to the load calculation device.

In the instances where the local calculation device is provided with the $\Delta T$ value directly it may be necessary to provide a secondary ambient temperature sensing element where it is necessary to know the ambient temperature separately from the $\Delta T$ value. In these instances though it is only necessary to provide one such additional sensing element per enclosure.

Furthermore, when it is known that none of the electrical joints are compromised and one desires to run an electrical circuit either at elevated electrical loads or elevated ambient temperatures, as discussed in detail later, it is only necessary to provide a single first sensing element which either measures the temperature of the conductor or joint and a second sensing element which measures the ambient air temperature per enclosure.

The first and second sensing elements 22, 24, 26, 28 are either directly or indirectly connected to a load calculation device 30 which continuously receives and may additionally log the temperature values which have been continuously measured by each of the first and second sensing elements 22, 24, 26, 28, to provide the load calculation device 30 with real time data. The load calculation device 30 may receive the temperature values via a cable or via wireless means.

The electrical circuit is also provided with a metering device 32, 34, 36, 38 which continuously monitors the electrical load being put through the electrical circuit (i.e. the electrical current). In FIG. 1 the metering devices 32, 34, 36 are integrated energy meters located within the electrical circuit and metering device 38 is a third party energy meter located externally to the electrical circuit.

The metering device 32, 34, 36, 38 may be directly connected to the load calculation device 30 or in the alternative the metering device 32, 34, 36, 38 may be indirectly connected to the load calculation device 30 via a secondary system to which the metering device 32, 34, 36, 38 is connected to such as a building management system, electrical monitoring system, power management system or the like.

The load calculation device 30 continuously receives and may additionally log the electrical load values which have been continuously provided by the metering device 32, 34, 36, 38, to provide the software with real time data. The load calculation device 30 may receive the electrical load values via cable or via wireless means.

The load calculation device 30 may be located remote from the electrical circuit 10 and thus the electrical joint 12, 14.

The load calculation device 30 may be for example a computer provided with computer software, in the alternative the load calculation device may be PLCs (process logic controllers), process control devices, automation control devices, processors for process control devices or the like.

Method of Determining the Electrical Load that can be Applied to a Compromised Electrical Joint The load calculation device, using the maximum electrical load the electrical circuit and thus the electrical joint is designed to operate at, the ΔT value of the electrical joint and actual electrical load, continuously calculates the maximum electrical load that the electrical joint can safely handle in real time. The load calculation device also continuously calculates the remaining electrical load that the electrical joint can safely handle and the ΔT value that the electrical joint will reach if operated at the maximum electrical load that the electrical circuit and thus the electrical joint is designed to operate at.

The load calculation device uses the following calculations to continuously calculate in real time the maximum safe operating electrical load for the electrical joint and the remaining electrical load that can be placed on the electrical joint before the maximum electrical load that the electrical joint can safely operate at is exceeded. It should be noted that the electrical load that the electrical circuit is designed to operate at is the same as the electrical load that the electrical joint is designed to operate at.

Equation Set 1

$$\left(\frac{\text{actual load of electrical joint}}{\text{design load of electrical joint}}\right) \times 100 =$$

% load (applied to the electrical joint)

$$\frac{100^2}{\% \text{ load}^2} = \text{temperature ratio}$$

temperature ratio × actual ΔT value =

ΔT value at design load of electrical joint $$\sqrt{\frac{\Delta T \text{ value at design load of electrical joint}}{\text{maximum } \Delta T \text{ value allowed}}} =$$

equivalent temperature load ratio $$\frac{\text{design load of electrical joint}}{\text{equivalent temperature load ratio}} =$$

maximum electrical load maximum load − actual load of electrical joint = load remaining

The load remaining value is provided with a cap to stop this value from exceeding [design load of electrical joint−actual load of electrical joint], should the ambient temperature of the air within the enclosure be below 40° C. at full electrical load values for example.

Example 1

Actual electrical joint load=201 Amps
Design electrical joint load=619 Amps
Actual ΔT=4.5° C.
Maximum ΔT=40° C.

$$\left(\frac{201}{619}\right) \times 100 = 32.47\%$$

$$\frac{100^2}{32.47^2} = \frac{10000}{1054.30} = 9.48$$

9.48 × 4.5° C. = 42.66° C.

$$\sqrt{\frac{42.66}{40.00}} = 1.03$$

$$\frac{619}{1.03} = 600.97 \text{ Amps maximum load}$$

600.97 − 201 =

399.97 Amps remaining before the electrical joint and thus the electrical circuit exceeds maximum allowed ΔT value of 40° C.

The load calculation device would therefore calculate in real time:
  maximum electrical load of 600.97 Amps that the electrical joint and thus the electrical circuit can safely handle;
  remaining load of 399.97 Amps that we can expect the electrical joint and thus the electrical circuit to safely handle;
  ΔT value of 42.66° C. that the electrical joint will reach if allowed to run at the design load of the electrical circuit, and thus the design load of the electrical joint.

The load calculation device provides to the operator in real time;
  current ΔT value that the electrical joint is operating at in ° C. or ° F.;

design load of the electrical circuit and thus the design load of the electrical joint in Amps;

actual electrical load applied to the electrical joint in Amps;

ΔT value of the electrical joint if 100% electrical joint design load is applied to the electrical joint in ° C.;

maximum electrical load, that can be applied to the electrical joint so that it still operates safely and below a given actual temperature threshold, in Amps;

along with other interactive capabilities.

The load calculation device continuously monitors the values and makes the calculations to enable the user to locate compromised electrical joints at any operating electrical loads in real time. The load calculation device also calculates in real time the additional electrical load that can be safely handled by the electrical joint and thus the electrical circuit. This means that any such compromised joints do not have additional electrical load applied to them which otherwise result in failure of the compromised joint along with associated safety issues and economic loss. In addition the load calculation device can be used to identify the degeneration of an electrical joint in an electrical circuit over the lifetime of the electrical circuit to enable for accurate determination of when the electrical circuit and/or joint should be replaced or its electrical load capacity reduced.

The load calculation device may additionally be provided with a stop mechanism that prevents the electrical load being applied to the electrical joint from being increased beyond the safe maximum electrical load in the event that a compromised electrical joint has been located by the load calculation device, i.e. when safe maximum electrical load is less than the design load of the electrical joint and thus the electrical circuit.

Method of Determining the Electrical Load that can be Applied to an Electrical Circuit at a Given Ambient Temperature The load calculation device, using the maximum electrical load the circuit is designed to operate at, the ΔT value of the electrical conductor, which may be the ΔT value of an electrical joint or the ΔT value of the conductor remote from an electrical joint, actual circuit load and ambient temperature, continuously calculates in real time the maximum electrical load that the electrical circuit can safely handle. The load calculation device also continuously calculates in real time the remaining electrical load that the electrical circuit can safely handle and the actual conductor temperature that the conductor will reach if operated at the maximum electrical load that the electrical circuit is designed to operate at and thus the amount that the ambient temperature would need to be reduced by to allow the electrical circuit to be operated at maximum load without exceeding the maximum allowed temperature for the electrical circuit.

In the case where the ΔT value of the electrical conductor is taken at a point remote from an electrical joint the load calculation device will assume that none of the electrical joints in the electrical circuit have been compromised and furthermore will not be able to detect if any of the electrical joints have been compromised. In the case where the ΔT value of the electrical conductor is taken at or adjacent to an electrical joint the load calculation device will, in addition to calculating the correct safe electrical load for a given ambient temperature, be able to detect if such an electrical joint has been compromised and factor this into the calculations to calculate the correct safe electrical load for a given ambient temperature.

The load calculating device uses the following calculations to continuously calculate in real time the maximum safe operating electrical load for the electrical circuit and the remaining electrical load that can be placed on the electrical circuit before the maximum electrical load that the electrical circuit can safely be operated at is exceeded for the ambient temperature. The following calculations assume that the ΔT value is taken on a conductor at a point remote from any electrical joints. However, if it also desired to detect any compromised joints and adjust the electrical load to take into account any such compromised joints as well as the ambient temperature such calculations are combined with those provided in Equation Set 1 that are used to determine the electrical load that can be applied to a compromised electrical joint as set out in Equation Set 3 and Example 3 further below.

$$\left(\frac{\text{electrical load of electrical circuit}}{\text{design load of electrical circuit}}\right) \times 100 =$$

% load (applied to electrical circuit)

$$\frac{100^2}{\% \text{ load}^2} = \text{temperature ratio}$$

temperature ratio × actual ΔT value = ΔT value at 100% load

ΔT value at 100% load + ambient temperature = conductor temperature at design load $$\sqrt{\frac{\text{conductor temperature at design load}}{\text{maximum conductor temperature allowed for the circuit}}} =$$

equivalent temperature load ratio $$\frac{\text{design load of electrical circuit}}{\text{equivalent temperature load ratio}} = \text{maximum load}$$

maximum load − actual load of electrical circuit = load remaining

The load remaining value is provided with a cap to stop this value from exceeding [design load of electrical circuit−actual load of electrical circuit], should the conductor temperature be below 85° C. at full load values for example, or other standard as required.

Using the above equations the load calculation device continuously calculates in real time the value of the maximum electrical load a given electrical circuit can safely operate at before exceeding the given threshold for temperature rise on the conductors in the electrical circuit which is for example 85° C. as set out in BS159, and the value of the remaining electrical load that can be placed on the circuit before the maximum electrical load for the given circuit is exceeded. ANSI, IEC and UL have similar standards and the actual threshold for temperature rise will depend on the particular standard that is in force and recommended by each manufacturer.

Example 2

Actual circuit load=201 Amps
Design circuit load=619 Amps
Actual ΔT=6.0° C.
Ambient temperature=35° C.

$$\left(\frac{201}{619}\right) \times 100 = 32.47\%$$

$$\frac{100^2}{32.47^2} = \frac{10000}{1054.30} = 9.48$$

-continued 9.48 × 6.0° C. = 56.88° C.

56.88° C. + 35.00° C. = 91.88° C. (actual joint temperature)

$$\sqrt{\frac{91.88}{85.00}} = 1.04$$

$$\frac{619}{1.04} = 595.19 \text{ Amps maximum electrical load}$$

595.19 − 201 = 394.19 Amps remaining before circuit exceeds maximum allowed conductor temperature of 85° C.

The load calculation device would therefore calculate in real time:
  maximum electrical load of 595.19 Amps that the circuit can safely handle;
  remaining load of 394.19 Amps that we can expect the circuit to safely handle;
  an actual temperature of the electrical joint of 91.88° C. that the electrical joint will reach if allowed to run at the design circuit load.

The load calculation device then subtracts the maximum allowed electrical conductor temperature from the actual conductor temperature, i.e. 85.0° C.-91.88° C., to provide the value that the ambient temperature needs to be reduced by to bring the conductor temperature in line with the acceptable standards i.e. 6.88° C.

The load calculation device provides to the operator continuously in real time;
  current ΔT that the electrical conductor is operating at in ° C. or ° F.;
  design load of the electrical circuit and thus the electrical conductor in Amps;
  actual electrical load applied to the electrical circuit and thus the electrical conductor in Amps;
  local ambient temperature in ° C. or ° F.;
  the temperature that the electrical conductor will reach if 100% electrical load is applied to the electrical conductor in ° C. or ° F.;
  the maximum electrical load that can be applied to the electrical conductor and thus the electrical circuit to stay below the defined threshold in Amps; the remaining electrical load that can be safely applied to the electrical circuit in Amps;
  the reduction in ambient temperature required to bring the electrical conductor in line with the applicable standard, or other threshold in ° C. or ° F.;
along with other interactive capabilities.

The temperature reduction can be achieved manually or may be automatically provided by the load calculation device which may for example automatically start cooling fans or liquid cooling systems such as water cooling devices located close to the electrical circuit within the enclosure for example or lower the temperature of the room or other enclosure in which the electrical circuit is located. In addition the load calculation device may communicate with a BMS/SCADA system to facilitate such changes in room or enclosure temperature.

This means that the operator would know in real time the maximum electrical load that could be applied to an electrical circuit based on the real time ambient temperature. This also means that the ambient temperature could be cooled by the required amounts to safely allow the electrical circuit to operate at 100% electrical load in elevated ambient temperatures. Similarly the load calculation device allows for safe operation of the electrical circuit at levels above 100% electrical load by reducing the ambient temperature to compensate. In addition the load calculation device can be used to identify the degeneration of an electrical joint in an electrical circuit over the lifetime of the electrical circuit to enable for accurate determination of when the electrical circuit and/or joint should be replaced or its electrical load capacity reduced.

In the case where it is also desired to detect any compromised electrical joints and adjust the electrical load to take into account any such compromised electrical joints as well as the ambient temperature the load calculation devices uses both of the calculations detailed above wherein the ΔT values are taken at or adjacent to such electrical joints. Once the load calculation device has made the two sets of calculations, the lowest maximum electrical load calculated is taken to be the maximum electrical load for the electrical joint taking into account both the ambient temperature and integrity of the electrical joint.

Method of Determining the ΔT Value Threshold an Electrical Joint at any Electrical Load The load calculation device also provides for a dynamic ΔT value threshold. This allows for an alarm or other signal to be set off when a compromised electrical joint is identified irrespective of the electrical load being applied to the electrical joint.

The load calculation device uses the maximum allowed ΔT value of the electrical joint and the % electrical load to calculate the ΔT value alarm threshold using the following calculations.

Equation Set 3

$$\left(\frac{\text{actual load of electrical joint}}{\text{design load of electrical joint}}\right) \times 100 =$$

% load (applied to the electrical joint)

$$\text{Maximum allowed } \Delta T \text{ value} \times \left(\frac{\% \text{ load}}{100}\right)^2 = \Delta T \text{ value threshold}$$

Example 3

For a maximum allowed ΔT value of 40° the ΔT value threshold at 40% electrical load is calculated as follows:

$$40 \times \left(\frac{40}{100}\right)^2 = 6.4° \text{ C. } \Delta T \text{ value threshold}$$

The load calculation device provides to the operator continuously in real time;
  current ΔT value that the electrical joint is operating at in ° C. or ° F.;
  design load of the electrical circuit and thus the electrical joint in Amps;
  actual electrical load applied to the electrical circuit and thus the electrical joint in Amps;
  ΔT value alarm threshold for the % electrical load utilized on the circuit in ° C. or ° F., equivalent to that which would apply at 100% electrical load.
along with other interactive capabilities.

The invention claimed is:
1. A dynamic thermal mapping system, comprising:
  a temperature sensor to continuously output in real time a temperature differential (ΔT) between a section of an electrical circuit and an ambient air temperature in which the section of the electrical circuit resides;

a current measuring device to continuously output in real time an actual electrical load applied to the electrical circuit;

a processor that continuously receives in real time, as inputs, the output of the temperature sensor and the output of the current measuring device;

wherein the processor is configured to continuously calculate in real time a percentage electrical load applied to the electrical circuit based on the actual electrical load applied to the electrical circuit and a design load of the electrical circuit;

wherein when the section of the electrical circuit comprises an electrical joint, the processor further is configured to continuously determine in real time a maximum temperature differential allowed between the electrical joint and the ambient air temperature in which the electrical joint resides, and when the section of the electrical circuit comprises a conductor remote from an electrical joint the processor further is configured to continuously determine in real time a maximum conductor temperature allowed for the electrical circuit;

wherein the processor is configured to continuously calculate in real time a maximum electrical load that can be applied to the electrical joint by the following calculations:

a. $\left(\dfrac{\text{actual load of electrical joint}}{\text{design load of electrical joint}}\right) \times 100 =$ % load (applied to electrical joint)

b. $\dfrac{100^2}{\% \text{ load}^2} = \text{temperature ratio}$ c. temperature ratio × actual $\Delta T$ value =

$\Delta T$ value at design load of electrical joint d. $\sqrt{\dfrac{\Delta T \text{ value at design load of electrical joint}}{\text{maximum } \Delta T \text{ value allowed}}} =$ equivalent temperature load ratio e. $\dfrac{\text{design load of electrical joint}}{\text{equivalent temperature load ratio}} = \text{maximum electrical load.}$ wherein the processor is further configured to continuously determine in real time if the electrical joint is compromised by comparing the maximum electrical load with the design load of the electrical joint, wherein an electrical joint is compromised if the maximum electrical load is less than the design load of the electrical joint;

wherein the system further comprises an alarm wherein the alarm is activated when the maximum electrical load is greater than the design load of the electrical joint to notify that a compromised electrical joint has been located; and wherein the system further comprises a switch which communicates with a control device for supplying electrical load to the electrical circuit, such that the switch prevents the control device from increasing the electrical load beyond the safe maximum electrical load of the compromised electrical joint when the alarm has been activated.

2. The dynamic thermal mapping system of claim 1, wherein the switch prevents the control device from supplying an electrical load to the electrical circuit when the alarm has been activated.

3. The dynamic thermal mapping system of claim 1, wherein the temperature sensor comprises a first sensing element for receiving the temperature of the section of the electrical circuit and a second sensing element for receiving the temperature of the ambient air in which the electrical circuit resides, wherein the second sensing element may be separate from the first sensing element or combined with the first sensing element.

4. A dynamic thermal mapping system, comprising:
a temperature sensor to continuously output in real time a temperature differential ($\Delta T$) between a section of an electrical circuit and an ambient air temperature in which the section of the electrical circuit resides;

a current measuring device to continuously output in real time an actual electrical load applied to the electrical circuit;

a processor that continuously receives in real time, as inputs, the output of the temperature sensor and the output of the current measuring device;

wherein the processor is configured to continuously calculate in real time a percentage electrical load applied to the electrical circuit based on the actual electrical load applied to the electrical circuit and a design load of the electrical circuit;

wherein when the section of the electrical circuit comprises an electrical joint, the processor further is configured to continuously determine in real time a maximum temperature differential allowed between the electrical joint and the ambient air temperature in which the electrical joint resides, and when the section of the electrical circuit comprises a conductor remote from an electrical joint the processor further is configured to continuously determine in real time a maximum conductor temperature allowed for the electrical circuit;

wherein the processor is configured to continuously calculate in real time a maximum electrical load that can be applied to the electrical circuit when the electrical circuit is at a particular ambient temperature by the following calculations:

a. $\left(\dfrac{\text{electrical load of electrical circuit}}{\text{design load of electrical circuit}}\right) \times 100 =$ % load (applied to electrical circuit)

b. $\dfrac{100^2}{\% \text{ load}^2} = \text{temperature ratio}$ c. temperature ratio × actual $\Delta T$ value = $\Delta T$ value at 100% load d. $\Delta T$ value at 100% load + ambient temperature = conductor temperature at design load e. $\sqrt{\dfrac{\text{conductor temperature at design load}}{\text{maximum conductor temperature allowed for the circuit}}} =$ equivalent temperature load ratio f. $\dfrac{\text{design load of electrical circuit}}{\text{equivalent temperature load ratio}} = \text{maximum load.}$ wherein the processor continuously outputs in real time a signal indicating an ambient temperature reduction requirement indicative of a temperature reduction needed to control the ambient air temperature in which the section of the circuit resides such that the maximum load equals or can be increased beyond the design load of the electrical circuit; and wherein the system further comprises a fan, air conditioning system or liquid cooling system to control the air ambient temperature in which the section of the circuit resides; and wherein the fan, air conditioning system or liquid cooling system controls the ambient temperature such that the maximum load equals at least the design load of the electrical circuit.

5. The dynamic thermal mapping system of claim 4, wherein the fan, air conditioning system or liquid cooling system controls the ambient temperature such that the maximum load can be increased beyond the design load of the electrical circuit.

6. The dynamic thermal mapping system of claim 4, wherein the temperature sensor comprises a first sensing element for receiving the temperature of the section of the electrical circuit and a second sensing element for receiving the temperature of the ambient air in which the electrical circuit resides, wherein the second sensing element may be separate from the first sensing element or combined with the first sensing element.

7. A dynamic thermal mapping system, comprising:
a temperature sensor to continuously output in real time a temperature differential ($\Delta T$) between a section of an electrical circuit and an ambient air temperature in which the section of the electrical circuit resides;
a current measuring device to continuously output in real time an actual electrical load applied to the electrical circuit;
a processor that continuously receives in real time, as inputs, the output of the temperature sensor and the output of the current measuring device;
wherein the processor is configured to continuously calculate in real time a percentage electrical load applied to the electrical circuit based on the actual electrical load applied to the electrical circuit and a design load of the electrical circuit;
wherein when the section of the electrical circuit comprises an electrical joint, the processor further is configured to continuously determine in real time a maximum temperature differential allowed between the electrical joint and the ambient air temperature in which the electrical joint resides, and when the section of the electrical circuit comprises a conductor remote from an electrical joint the processor further is configured to continuously determine in real time a maximum conductor temperature allowed for the electrical circuit;
wherein the processor is configured to continuously calculate in real time a maximum electrical load that can be applied to the electrical circuit based on the temperature differential, the percentage electrical load applied to the electrical circuit, and either the maximum temperature differential or maximum conductor temperature by the following calculations:

a. $\left(\dfrac{\text{electrical load of electrical circuit}}{\text{design load of electrical circuit}}\right) \times 100 =$ $\%\ \text{load (applied to electrical circuit)}$ b. $\dfrac{100^2}{\%\ load^2} = \text{temperature ratio}$ c. $\text{temperature ratio} \times \text{actual } \Delta T \text{ value} =$ $\Delta T \text{ value at } 100\% \text{ load}$ d. $\Delta T$ value at 100% load + ambient temperature = conductor temperature at design load e. $\sqrt{\dfrac{\text{conductor temperature at design load}}{\text{maximum conductor temperature allowed for the circuit}}} =$ equivalent temperature load ratio f. $\dfrac{\text{design load of electrical circuit}}{\text{equivalent temperature load ratio}} = \text{maximum load}$ wherein the processor is further configured to continuously calculate in real time the electrical load remaining that can be applied to the electrical joint without exceeding the maximum electrical load; and wherein the system further comprises a switch which communicates with a control device for supplying electrical load to the electrical circuit, such that the switch prevents the control device from supplying an electrical load to the electrical circuit that would exceed the maximum electrical load.

8. The dynamic thermal mapping system of claim 7, wherein the temperature sensor comprises a first sensing element for receiving the temperature of the section of the electrical circuit and a second sensing element for receiving the temperature of the ambient air in which the electrical circuit resides, wherein the second sensing element may be separate from the first sensing element or combined with the first sensing element.

9. A non-transitory tangible computer readable storage medium having stored thereon a computer program for implementing a method for continuously determining in real time a maximum electrical load that can be applied to an electrical circuit, the computer program comprising a set of instructions which, when executed by a computer, cause the computer to perform a method comprising the steps of:
a. continuously determining in real time a temperature differential ($\Delta T$) between a section of the electrical circuit and an ambient air temperature in which the section of the electrical circuit resides;
b. continuously determining in real time an actual electrical load applied to the electrical circuit;
c. continuously determining in real time a percentage electrical load applied to the electrical circuit based on the actual electrical load applied to the electrical circuit and a design load of the electrical circuit;
wherein when the section of the electrical circuit comprises an electrical joint, the method further comprises continuously determining in real time a maximum temperature differential allowed of the electrical joint, and when the section of the electrical circuit comprises a conductor remote from an electrical joint the method further comprises continuously determining in real time a maximum conductor temperature allowed for the electrical circuit;
d. continuously determining in real time and continuously outputting in real time a signal indicative of a maximum electrical load that can be applied to the electrical circuit based on the determined temperature differential, the percentage electrical load applied to the electrical circuit and either the maximum temperature differential or maximum conductor temperature;

wherein the maximum electrical load that can be applied to the electrical joint is continuously determined in real time by the following calculations:

i. $\left(\frac{\text{actual load of electrical joint}}{\text{design load of electrical joint}}\right) \times 100 =$ % load (applied to electrical joint)

ii. $\frac{100^2}{\% \text{ load}^2} = \text{temperature ratio}$ iii. temperature ratio × actual $\Delta T$ value =

$\Delta T$ value at design load of electrical joint iv. $\sqrt{\frac{\Delta T \text{ value at design load of electrical joint}}{\text{maximum} \Delta T \text{ value allowed}}} =$ equivalent temperature load ratio v. $\frac{\text{design load of electrical joint}}{\text{equivalent temperature load ratio}} = \text{maximum temperature load}$ e. continuously determining in real time if the electrical joint is compromised by comparing the maximum electrical load with the design load of the electrical joint, wherein an electrical joint is compromised if the maximum electrical load is less than the design load of the electrical joint;

f. activating an alarm when the maximum electrical load is greater than the design load to notify that a compromised electrical joint has been located;

g. activating a switch which communicates with a control device for supplying electrical load to the electrical circuit, such that the switch prevents the control device from increasing the electrical load beyond the safe maximum electrical load of the compromised electrical joint when the alarm has been activated.

10. The non-transitory tangible computer readable storage medium of claim 9, wherein the switch prevents the control device from supplying an electrical load to the electrical circuit when the alarm has been activated.

11. A non-transitory tangible computer readable storage medium having stored thereon a computer program for implementing a method for continuously determining in real time a maximum electrical load that can be applied to an electrical circuit, the computer program comprising a set of instructions which, when executed by a computer, cause the computer to perform a method comprising the steps of:

a. continuously determining in real time a temperature differential ($\Delta T$) between a section of the electrical circuit and an ambient air temperature in which the section of the electrical circuit resides;

b. continuously determining in real time an actual electrical load applied to the electrical circuit;

c. continuously determining in real time a percentage electrical load applied to the electrical circuit based on the actual electrical load applied to the electrical circuit and a design load of the electrical circuit;

wherein when the section of the electrical circuit comprises an electrical joint the method further comprises continuously determining in real time a maximum temperature differential allowed of the electrical joint, and when the section of the electrical circuit comprises a conductor remote from an electrical joint the method further comprises continuously determining in real time a maximum conductor temperature allowed for the electrical circuit;

d. continuously determining in real time and continuously outputting in real time a signal indicative of a maximum electrical load that can be applied to the electrical circuit based on the determined temperature differential, the percentage electrical load applied to the electrical circuit and either the maximum temperature differential or maximum conductor temperature;

wherein the maximum electrical load that can be applied to the electrical joint is continuously determined in real time by the following calculations:

i. $\left(\frac{\text{actual load of electrical joint}}{\text{design load of electrical joint}}\right) \times 100 =$ % load (applied to electrical joint)

ii. $\frac{100^2}{\% \text{ load}^2} = \text{temperature ratio}$ iii. temperature ratio × actual $\Delta T$ value =

$\Delta T$ value at design load of electrical joint iv. $\sqrt{\frac{\Delta T \text{ value at design load of electrical joint}}{\text{maximum} \Delta T \text{ value allowed}}} =$ equivalent temperature load ratio v. $\frac{\text{design load of electrical joint}}{\text{equivalent temperature load ratio}} = \text{maximum temperature load}$ e. continuously calculating in real time the electrical load remaining that can be applied to the electrical joint without exceeding the maximum electrical load; and f. preventing the electrical load that can be applied to the electrical joint from exceeding the maximum electrical load by communicating with a switch which communicates with a control device for supplying electrical load to the electrical circuit, such that the switch prevents the control device from supplying an electrical load to the electrical circuit that would exceed the maximum electrical load.

12. A non-transitory tangible computer readable storage medium having stored thereon a computer program for implementing a method for continuously determining in real time a maximum electrical load that can be applied to an electrical circuit, the computer program comprising a set of instructions which, when executed by a computer, cause the computer to perform a method comprising the steps of:

a. continuously determining in real time a temperature differential ($\Delta T$) between a section of the electrical circuit and an ambient air temperature in which the section of the electrical circuit resides;

b. continuously determining in real time an actual electrical load applied to the electrical circuit;

c. continuously determining in real time a percentage electrical load applied to the electrical circuit based on the actual electrical load applied to the electrical circuit and a design load of the electrical circuit;

wherein when the section of the electrical circuit comprises an electrical joint the method further comprises continuously determining in real time a maximum temperature differential allowed of the electrical joint, and when the section of the electrical circuit comprises a conductor remote from an electrical joint the method further comprises continuously determining in real time a maximum conductor temperature allowed for the electrical circuit;

d. continuously determining in real time and continuously outputting in real time a signal indicative of a maximum electrical load that can be applied to the electrical circuit based on the determined temperature differential, the percentage electrical load applied to the electrical circuit and either the maximum temperature differential or maximum conductor temperature;

wherein the maximum electrical load that can be applied to the electrical circuit when the electrical circuit is at a particular ambient temperature is continuously determined in real time by the following calculations:

i. $\left(\frac{\text{electrical load of electrical circuit}}{\text{design load of electrical circuit}}\right) \times 100 =$
% load (applied to electrical circuit)

ii. $\frac{100^2}{\%\ \text{load}^2} = \text{temperature ratio}$ iii. temperature ratio × actual $\Delta T$ value = $\Delta T$ value at 100% load iv. $\Delta T$ value at 100% load + ambient temperature = conductor temperature at design load v. $\sqrt{\frac{\text{conductor temperature at design load}}{\text{maximum conductor temperature allowed for the circuit}}} =$
equivalent temperature load ratio vi. $\frac{\text{design load of electrical circuit}}{\text{equivalent temperature load ratio}} = \text{maximum load}$ e. communicating with a fan, air conditioning system or liquid cooling system to control the air ambient temperature in which the section of the circuit resides such that the maximum load equals or can be increased beyond the design load of the electrical circuit.

13. The non-transitory tangible computer readable storage medium of claim 12, wherein the method further comprises communicating with the fan, air conditioning system or liquid cooling system to control the air ambient temperature in which the section of the circuit resides such that the maximum load equals the design load of the electrical circuit.

14. The non-transitory tangible computer readable storage medium of claim 12, wherein the method further comprises communicating with the fan, air conditioning system or liquid cooling system to control the air ambient temperature in which the section of the circuit resides such that the maximum load can be increased beyond the design load of the electrical circuit.

15. A dynamic thermal monitoring system, comprising:
an electrical joint temperature sensor to continuously output in real time an electrical joint temperature of an electrical joint;
an ambient air temperature sensor to continuously output in real time an ambient air temperature of air surrounding the electrical joint;
a current measuring device to continuously output in real time an actual electrical load applied to the electrical joint;
a processor that continuously receives in real time, as inputs, the actual electrical load applied to the electrical joint and either: (1) the electrical joint temperature from the electrical joint temperature sensor and the ambient air temperature from the ambient air temperature sensor; or (2) a difference between the electrical joint temperature and the ambient air temperature (actual $\Delta T$ value), and using the inputs continuously calculates, in real time, a maximum electrical load that may be applied to the electrical joint by:

(1) determining a percentage electrical load applied to the electrical joint based on the actual electrical load applied to the electrical joint and a design load of the electrical joint using equation (a):

a. $\left(\frac{\text{actual load of electrical joint}}{\text{design load of electrical joint}}\right) \times 100 =$
% load (applied to the electrical joint)

(2) determining a temperature ratio for the electrical joint using equation (b):

b. $\frac{100^2}{\%\ \text{load}^2} = \text{temperature ratio}$ (3) determining an expected temperature differential ($\Delta T$ at design load of electrical joint) between the joint temperature and ambient air temperature that would be expected to be experienced by the electrical joint if the electrical joint were to be operated at the design load using equation (c):

temperature ratio*actual $\Delta T$ value=$\Delta T$ value at design load of electrical joint     c.

(4) determining an equivalent temperature load ratio for the electrical joint based on the expected temperature differential ($\Delta T$ value at the design load of the electrical joint) and the maximum temperature differential for the electrical joint (maximum $\Delta T$ value allowed) using equation (d):

d. $\sqrt{\frac{\Delta T\ \text{value at design load of electrical joint}}{\text{maximum}\ \Delta T\ \text{value allowed}}} =$
equivalent temperature load ratio (5) determining the maximum electrical load that may be applied to the electrical joint under current operating conditions using equation (e):

e. $\frac{\text{design load of electrical joint}}{\text{equivalent temperature load ratio}} = \text{maximum electrical load}$ (6) outputting an indication of the maximum electrical load that may be applied to the electrical joint under the current operating conditions;
the method further comprising;
iterating the steps of calculating and outputting the maximum electrical load, by the processor; and
dynamically adjusting the actual electrical load applied to the electrical joint based on the calculated maximum electrical load output by the processor.

* * * * *